United States Patent
Imbert et al.

(10) Patent No.: US 10,283,364 B2
(45) Date of Patent: May 7, 2019

(54) METHOD FOR ASSEMBLING SUBSTRATES BY BONDING INDIUM PHOSPHATE SURFACES (71) Applicant: COMMISSARIAT A L'ENERGIE ATOMIQUE ET AUX ENERGIES ALTERNATIVES, Paris (FR)

(72) Inventors: Bruno Imbert, Grenoble (FR); Hubert Moriceau, Saint-Egreve (FR); Xavier Blot, Grenoble (FR)

(73) Assignees: COMMISSARIAT A L'ENERGIE ATOMIQUE ET AUX ENERGIES ALTERNATIVES, Paris (FR); SOITEC, Bernin (FR)

( * ) Notice: Subject to any disclaimer, the term of this patent is extended or adjusted under 35 U.S.C. 154(b) by 0 days.

(21) Appl. No.: 15/774,122

(22) PCT Filed: Nov. 7, 2016

(86) PCT No.: PCT/EP2016/076806
§ 371 (c)(1),
(2) Date: May 7, 2018

(87) PCT Pub. No.: WO2017/080944
PCT Pub. Date: May 18, 2017

(65) Prior Publication Data
US 2018/0330950 A1 Nov. 15, 2018

(30) Foreign Application Priority Data
Nov. 9, 2015 (FR) ...................... 15 60721

(51) Int. Cl.
H01L 21/46 (2006.01)
H01L 21/18 (2006.01)
(Continued)

(52) U.S. Cl.
CPC .............. *H01L 21/187* (2013.01); *C09J 5/02* (2013.01); *C09J 5/06* (2013.01); *H01L 24/83* (2013.01); *C09J 2203/326* (2013.01)

(58) Field of Classification Search
CPC combination set(s) only.
See application file for complete search history.

(56) References Cited

U.S. PATENT DOCUMENTS 5,966,622 A 10/1999 Levine et al.
6,180,496 B1 1/2001 Farrens et al.
(Continued)

FOREIGN PATENT DOCUMENTS

EP 0 908 933 A1 4/1999
WO WO 99/10927 A1 3/1999

OTHER PUBLICATIONS

International Search Report dated Dec. 19, 2016 in PCT/EP2016/076806 filed Nov. 7, 2016.
(Continued)

Primary Examiner — Robert G Bachner
(74) Attorney, Agent, or Firm — Oblon, McClelland, Maier & Neustadt, L.L.P.

(57) ABSTRACT

The invention concerns an assembly method comprising the following steps: a) providing a first substrate comprising a first face made from crystalline indium phosphide, b) providing a second substrate comprising a second crystalline face different from the indium phosphide, c) forming an intermediate layer of crystalline indium phosphide on the second face of the second substrate, d) forming an assembly, via a direct bonding step, by bringing the first face of the first substrate into contact with the intermediate layer, the direct bonding step being carried out in an atmosphere having a
(Continued)

pressure greater than 10−4 Pa, and preferably higher than 10−3 Pa, e) subjecting the assembly formed in step d) to heat treatment.

10 Claims, 3 Drawing Sheets

(51) Int. Cl.
*C09J 5/02* (2006.01)
*C09J 5/06* (2006.01)
*H01L 23/00* (2006.01)

(56) References Cited

U.S. PATENT DOCUMENTS

| | | |
|---|---|---|
| 6,645,828 B1 | 11/2003 | Farrens et al. |
| 2004/0132304 A1 | 7/2004 | Farrens et al. |

OTHER PUBLICATIONS

French Preliminary Search Report dated Jun. 10, 2016 in French Application 1560721 filed Nov. 9, 2015.
Wada, H. et al., "Room-Temperature Cw Operation of InGaAsP Lasers on Si Fabricated by Wafer Bonding", IEEE Photonics Technology Letters, vol. 8, No. 2, Feb. 1996, pp. 173-175, XP011424960.
Uchida, S. et al., "Room-temperature GaAs/InP wafer bonding with extremely low resistance", Applied Physics Express, vol. 7, 2014, 5 total pages.
Matthews, J.W. et al., "Defects in Epitaxial Multilayers", Journal of Crystal Growth, vol. 27, 1974, pp. 118-125.
Malhotra, V. et al., "Passivation of GaAs and InP", Handbook of Compound Semiconductors, Cambridge University Press, Chapter 7, Oct. 19, 2008, pp. 328-369.
Jin-Phillipp, N.Y. et al., "Interface of directly bonded GaAs and InP", Journal of Applied Physics, vol. 89, No. 2, Jan. 15, 2001, 9 total pages.
Shi, F. et al., "Hybrid-integrated GaAs/GaAs and InP/GaAs semiconductors through wafer bonding technology: Interface adhesion and mechanical strength", Journal of Applied Physics, vol. 93, No. 9, May 1, 2003, 8 total pages.
Jalaguier, E. et al., "Transfer of thin InP films onto silicon substrate by proton implantation process", 11th International Conference on Indium Phosphide and Related Materials, May 16-20, 1999, pp. 26-27.
U.S. Appl. No. 14/893,396, filed Nov. 23, 2015, US 2016-0126215 A1, Bruno Imbert et al.
U.S. Appl. No. 15/340,377, filed Nov. 1, 2016, US 2017-0133347 A1, Hubert Moriceau et al.
U.S. Appl. No. 15/321,418, filed Dec. 22, 2016, US 2017-0213807 A1, Lamine Benaissa et al.
U.S. Appl. No. 15/519,203, filed Apr. 14, 2014, US 2017-0236800 A1, Paul Gondcharton et al.
U.S. Appl. No. 15/525,718, filed Nov. 17, 2015, Stephane Cadra et al.
U.S. Appl. No. 15/571,573, filed Nov. 3, 2017, Frank Fournel et al.
U.S. Appl. No. 13/808,703, filed Jan. 7, 2013, US 2013-011179 A1, Chrystel Deguet et al.

METHOD FOR ASSEMBLING SUBSTRATES BY BONDING INDIUM PHOSPHATE SURFACES

TECHNICAL FIELD AND PRIOR ART

The invention relates to a method for assembling a first substrate and a second substrate, the assembling being intended for use in the field of energy, optoelectronics, and microelectronics.

Figure 1:
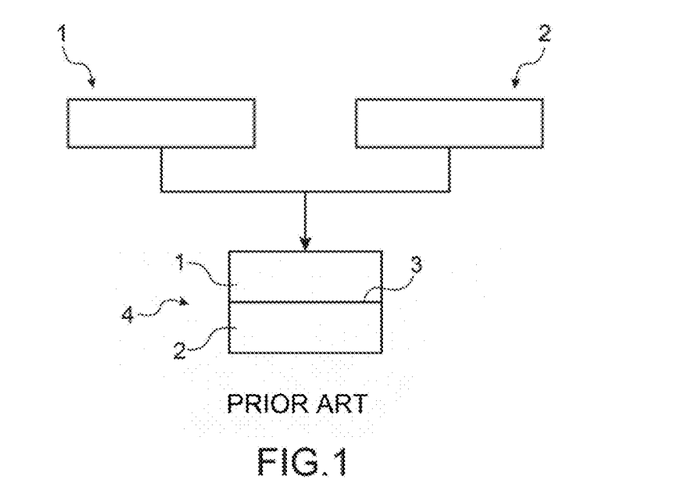
FIG. 1 is a schematic representation of the method of production of the heterostructure 4 according to a known method of prior art.

FIG. 1 shows a method for assembling, known from prior art and described by Shiro Uchida et al. [1], that comprises the following steps:
 a) providing a first substrate 1 of crystalline indium phosphide comprising a first face,
 b) providing a second substrate 2 of crystalline gallium arsenide comprising a second face,
 c) executing a cleaning of the first face and of the second face,
 d) activating the first face and the second face with a bombardment by an argon ion beam,
 e) assembling the first face and the second face.

At the end of the step e) of the known method of prior art, a heterostructure 4, comprising an assembly interface 3 between the first face and the second face, is obtained.

The step c) of cleaning comprises a cleaning in an alkaline solution.

According to this known method of prior art, it is possible to reach an electrical resistance at the assembly interface 3 of about $2.5 \times 10^{-5}$ $\Omega \cdot cm^2$.

However, this method is not satisfactory.

Indeed, in order to provide a low electrical and/or thermal resistivity at the assembly interface 3 formed by the first face and the second face, this method requires for the removal of the native oxides on said first and second faces before the step of assembling e).

To do this, the step d), of activating via bombardment by an argon ion beam, and the step e), of assembling, are executed in the same high vacuum chamber, and at a pressure less than $10^{-5}$ Pa. Maintaining such a vacuum throughout these two steps then prevents the regrowing of native oxide on the first and the second face after the step d), of activating via bombardment by an argon ion beam.

However, this method is very expensive because it requires a high vacuum chamber.

In addition, this method limits the through put required in the microelectronics, or optronics industries.

Moreover, the activating via bombardment by an argon ion beam increases the risk of particle contamination by abrasion of the surfaces of the indium phosphide 1 and gallium arsenide 2 substrates intended to be brought into contact.

Furthermore, the activating via bombardment by an ion beam degrades the crystalline quality in the vicinity of the surface of the substrates subjected to this treatment.

Alternatively, it has also been proposed to execute the step of assembling e) by thermocompression.

However, this mode of assembling by thermocompression is also not satisfying.

Indeed, an assembly by thermocompression requires the implementation of heavy and expensive equipment.

Moreover, an assembly by thermocompression is generally executed at a high temperature, in a low-oxygen environment, and requires the application of an external mechanical pressure on the substrates during said step of assembling. These operating conditions also limit the through put and are not always compatible with the requirements of the microelectronics or optronics industries.

However, the provision of heterostructures comprising a stack of indium phosphide and gallium arsenide having a low electrical and thermal resistance at the bonding interface is of great interest in the fields of energy, optoelectronics and microelectronics.

In particular, during the manufacture of photovoltaic cells, indium phosphide substrates 1 on gallium arsenide 2 are well suited for forming through epitaxial growth the junctions intended to transform the light energy into electrical energy.

Moreover, in order to be able to collect the current generated by the photovoltaic cells, it is necessary to obtain an electrical and/or thermal resistivity at the indium phosphide/gallium arsenide interface 3 that is as low as possible.

A purpose of the invention is then to propose a method for assembling, at ambient temperature and without the need to apply to the application of an external mechanical pressure, of a substrate comprising a first face made from crystalline indium phosphide with a crystalline substrate making it possible to obtain a low electric and/or thermal interface resistivity, and compatible with the requirements of the microelectronics industry in terms of costs, through put and ease of implementation.

DISCLOSURE OF THE INVENTION

The purpose mentioned hereinabove is achieved by a method for assembling comprising the following steps:
 a) providing a first substrate comprising a first face made from crystalline indium phosphide,
 b) providing a second substrate comprising a second crystalline face different from the indium phosphide,
 c) forming an intermediate layer of crystalline indium phosphide on the second face of the second substrate,
 d) forming an assembly, via a direct bonding step at ambient temperature and without applying external mechanical pressure, by bringing the first face of the first substrate into contact with the intermediate layer, the direct bonding step being carried out in an atmosphere having a pressure greater than $10^{-4}$ Pa, preferably higher than $10^{-3}$ Pa.
 e) subjecting the assembly, formed in the step d), to a heat treatment.

The term ambient temperature means a temperature between 15° C. and 25° C., preferably between 18° C. and 22° C., for example 20° C.

As such, the Applicant was able to observe that the method implemented according to the invention does not require executing a bombardment by an ion beam, or even high vacuum to execute the step d) of assembling, and despite all of this makes it possible to obtain an electric and/or thermal interface resistivity that is sufficiently low.

This effect is in the least surprising. Indeed, the bonding of an indium phosphide substrate on a substrate of a different nature, such as for example on gallium arsenide, generally requires bonding activation and bonding conditions in a very high vacuum.

As such, the formation of the intermediate layer on the second substrate makes it possible to carry out the step of assembling at an atmosphere having a pressure greater than $10^{-4}$ Pa, preferably higher than $10^{-3}$ Pa.

Moreover, since the step d) can be carried out in a moderate vacuum, the through put is not penalised, contrary to the known method of prior art.

Furthermore, the method according to the invention makes it possible to obtain heterostructures that cannot be obtained according to the known methods of assembling of prior art. In particular, the method according to the invention makes it possible to obtain heterostructures comprising crystalline indium phosphide on a silicon substrate.

According to an embodiment, the first face and the second face of the second substrate are monocrystalline, and the intermediate layer is formed according to a coherent epitaxial growth.

A coherent epitaxial growth makes it possible to obtain a monocrystalline intermediate layer.

As such, the formation of the intermediate layer by a coherent epitaxial growth prevents or reduces the generating of crystalline defects, such as dislocations, in said intermediate layer. This advantageously makes it possible to retain a relatively low roughness of the exposed surface of the intermediate layer and therefore compatible with a step of direct bonding. In addition, an absence or a reduced number of crystalline defects is very favourable for the carrying out of an assembly interface having low electrical, thermal and optical resistivities, and, in particular that limit the recombinations of carriers at the bonding interface. Consequently, the obtaining of an intermediate layer according to a coherent epitaxial growth makes it possible to further reduce the electrical and thermal resistivities of the interface formed by the first face and the intermediate layer, and to limit the recombinations of carriers on this interface.

Moreover, this configuration is particularly advantageous when monocrystalline structures are required.

According to an embodiment, the step e), of heat treatment, is suitable for allowing a connection, at least partial, of the crystalline lattices to the interface formed by the first face and the intermediate layer.

As such, a connection, at least partial, of the crystalline networks to the interface formed by the assembly of the first face and of the intermediate layer was also observed by the Applicant.

Moreover, the connection, at least partial, of the crystalline networks is made possible by the monocrystalline nature of the first face and of the intermediate layer.

Furthermore, the connection, at least partial, of the crystalline networks is also a factor of improvement of the electrical, thermal and optical resistivities of the assembly interface.

According to an embodiment, the step d) is carried out according to one of the following conditions:
in an atmosphere having a partial water pressure less than $10^{-1}$ Pa,
or
in a partial vacuum, with the partial vacuum having a pressure less than 10 Pa, preferably less than 1 Pa, more preferably less than $10^{-1}$ Pa.

As such, this embodiment has the interest of reducing the quantity of water present at the bonding interface during the step d).

Furthermore, little or no reaction products will be observed at the assembly interface, thus preventing the degradation of the electrical, thermal and optical proprieties of the assemblies formed as such.

According to an embodiment, the step c) of forming the intermediate layer is executed by a method of epitaxy, advantageously by MOCVD.

According to an embodiment, the step e), of heat treatment is executed at a temperature between 200° C. and 600° C., preferably between 300° C. and 600° C., more preferably between 300° C. and 500° C.

According to an embodiment, the step d), of direct bonding, is preceded by a step c1), of preparing the exposed surface of the intermediate layer and of the first face, the step c1) being suitable for preserving the crystallinity of the intermediate layer and of the first face.

According to an advantageous embodiment, the step c1) is also suitable for rendering the exposed surface of the intermediate layer and of the first face hydrophilic.

According to an embodiment, the second layer has a thickness less than 5 nm, preferably less than 2 nm.

According to an embodiment, the first substrate is made from indium phosphide, advantageously bulk.

According to an embodiment, the second substrate comprises at least one of the materials: gallium arsenide, silicon, silicon and germanium alloy, germanium, sapphire, alumina, silicon carbide, alloy of elements III and V.

BRIEF DESCRIPTION OF THE DRAWINGS

Other characteristics and advantages shall appear in the following description of embodiments of the method for assembling according to the invention, given by way of non-limiting examples, in reference to the annexed drawings wherein.

DETAILED DESCRIPTION OF PARTICULAR EMBODIMENTS

For the various embodiments, the same references will be used for elements that are identical or that provide the same function, in order to simplify the description.

Indium phosphide: Indium phosphide means any alloy that has the following chemical formula: $In_{1-x}(E_{III})_xP_{1-y}(E_V)_y$, $E_{III}$, and $E_V$ being, respectively, elements from column III and from column V of the periodic table of the elements, and with x and y less than 0.5, more preferably less than 0.2, even more preferably less than 0.05. The indium phosphide can also include doping elements, for example sulphur, iron, silicon.

InP chemical composition: InP chemical composition means indium phosphide such as defined hereinabove with x=y=0.

Coherent epitaxial growth: coherent epitaxial growth of a layer means the epitaxial growth of a monocrystalline layer on a monocrystalline substrate, and for which the monocrystalline layer has a thickness less than its critical thickness. In this case, the layer, having a thickness less than its critical thickness, has a lattice matched with the lattice of the substrate. In other words, the monocrystalline layer has the same lattice parameter as the substrate at any point of its volume. Consequently, the monocrystalline layer can have a stress. A monocrystalline layer, having a thickness greater than its critical thickness, will relax its internal stresses in such a way as to return to its natural lattice parameter. This relaxation phenomenon is accompanied by the generating of lattice misfit dislocations, as well as a degradation (increase) in the roughness of the exposed surface of the epitaxy layer.

Bulk substrate: bulk substrate means a substrate that has a substantially identical chemical composition at any point of its volume.

Figure 2A:
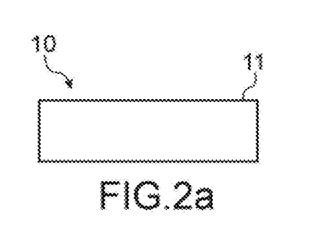
FIGS. 2a and 2b are schematic representations of a step of the method for assembling according to the first embodiment of the invention.
Figure 2B:
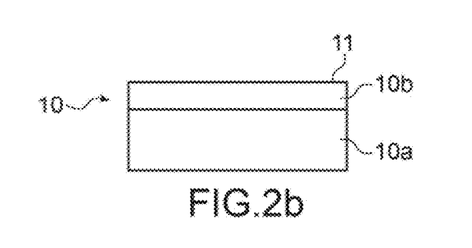

According to a first embodiment, the method for assembling, shown in FIGS. 2a and 2b, comprises a step a) consisting in providing a first substrate 10.

The first substrate 10 comprises a first face 11.

The first face 11 is made from crystalline indium phosphide, advantageously the indium phosphide is monocrystalline.

Advantageously, the roughness of the first face 11 is suitable for direct bonding. For example, the roughness of the first face 11 is less than 1 nm RMS ("RMS" is the abbreviation of "Root Mean Square"), preferably less than 0.5 nm RMS, and very preferably less than 0.3 nm RMS, measured in 5 µm×5 µm atomic force microscopy scan.

The first substrate 10 can comprise a support substrate 10a whereon rests a layer of crystalline indium phosphide 10b. The exposed surface of the layer of crystalline indium phosphide 10b, advantageously monocrystalline, is then the first face 11.

The layer of indium phosphide 10b can have a thickness between 0.2 nm and 5 nm, preferably less than 2 nm.

Advantageously, the first face 11 has for chemical composition InP.

The support substrate 10a can comprise at least one of the materials chosen from: indium phosphide, gallium arsenide, silicon, germanium silicon alloy, germanium, sapphire, alumina, silicon carbide, alloy of elements III and V.

Alternatively, the support substrate 10a can comprise indium phosphide. Advantageously, the first substrate 10 can be a bulk indium phosphide substrate.

The support substrate 10a can be stratified and include a stack of layers of functional semi-conductor materials, such as junctions, diodes, tunnel diodes.

The method for assembling comprises a step b), which consists in providing a second substrate 20. The second substrate 20 comprises a second crystalline face 21 different from indium phosphide. In other words, the chemical composition of the substrate 20 does not correspond to the chemical formula of indium phosphide given as a definition.

The second substrate 20 can, for example, comprise at least one of the materials: gallium arsenide, silicon, silicon and germanium alloy, germanium, sapphire, alumina, silicon carbide, alloy of elements III and V.

Figure 3:
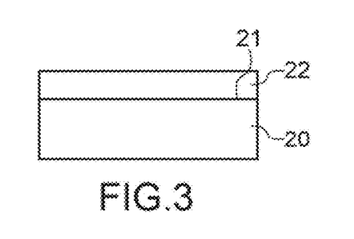
FIG. 3 is a schematic representation of a step of the method for assembling according to the first embodiment of the invention.

The second substrate 20 can be stratified and comprise a stack of layers of functional semi-conductor materials, such as junctions, diodes, tunnel diodes The method according to the invention comprises a step c), shown in FIG. 3, which comprises the formation of a crystalline intermediate layer 22 (the term crystalline means polycrystalline or monocrystalline) formed on the second face 21, also referred to as the front face 21, of the second substrate 20.

The intermediate layer 22 is made from crystalline indium phosphide.

The formation of the intermediate layer 22 can be preceded by a step of preparing the second face 21 in such a way as to reduce its roughness and/or deoxidise it. Those skilled in the art are able to determine the conditions making it possible to reduce the roughness and/or to deoxidise a surface, and can in this respect consult the reference [3] mentioned at the end of the description.

The intermediate layer 22 will be polycrystalline if it is formed on a second face 21 also polycrystalline.

Advantageously, the second face 21 of the second substrate 20 and the intermediate layer 22 are monocrystalline.

In this case, the intermediate layer 22 is formed by epitaxy according to a coherent epitaxial growth.

For example, it is possible to form an intermediate layer 22 of indium phosphide on a substrate 20 of gallium arsenide by metalorganic chemical vapour deposition (MOCVD). The intermediate layer 22 can as such be formed by using triethylindium (TeIn) or Trimethylindium (TMIn) and $PH_3$ as precursor gases, under a working pressure between 50 and 150 mbar, for example 100 mbar, and at a temperature between 500 and 700° C., preferably between 500 and 600° C., for example 550° C. According to a coherent epitaxial growth, the thickness of the intermediate layer 22 of indium phosphide formed on a substrate of gallium arsenide is less than 5 nm, according to the model described by Matthews et al. [2].

It is also possible to form the intermediate layer 22 by other techniques known to those skilled in the art such as: liquid phase epitaxy, molecular beam epitaxy, spraying, plasma enhanced chemical vapour deposition, pulsed laser deposition.

Advantageously, the intermediate layer 22 can have a thickness less than 5 nm, preferably less than 2 nm.

As such, in the case of a coherent epitaxial growth, the defectivity (the dislocations, the roughness of surface) of the intermediate layer 22 is relatively low.

Indeed, the intermediate layer 22, formed by epitaxy according to a coherent epitaxial growth, does not relax its stress. Consequently, there is no generation of dislocations in the intermediate layer 22, and the roughness of the exposed surface of said intermediate layer 22 is not degraded.

Advantageously, the roughness of the exposed surface of the intermediate layer 22 is suitable for direct bonding. For example, the roughness of the exposed surface of the intermediate layer 22 is less than 1 nm RMS, preferably less than 0.5 nm RMS, measured by atomic force microscopy, and according to a measuring range of 5 µm×5 µm.

Advantageously, the intermediate layer 22 can have for chemical composition InP.

The intermediate layer 22 can be thicker than desired after the formation thereof. It is then possible to adapt the thickness thereof by a step of thinning. Said step of thinning can be executed by dry or wet etching according to techniques well known to those skilled in the art, who can consult the reference [3] mentioned at the end of the description.

Figure 4:
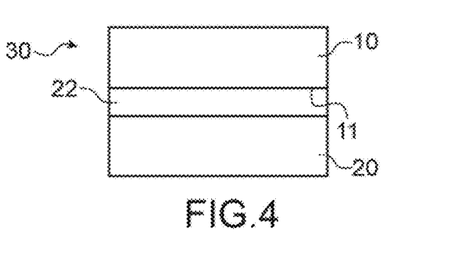
FIG. 4 is schematic representation of a step of the method for assembling according to the first embodiment of the invention.

The method according to the invention comprises a step d), shown in FIG. 4, which comprises a step of direct bonding of the first face 11 of the first substrate 10 with the exposed surface of the intermediate layer 22. During the step of direct bonding, the first face 11 and the exposed surface of the intermediate layer 22 are brought into contact, more particularly into intimate contact, in such a way that they can adhere to one another.

More particularly, the step d) of assembling is executed at ambient temperature and without applying external mechanical pressure. In other words, the step d) of assembling does not require the implementing of an assembly via thermocompression.

The term ambient temperature means a temperature between 15° C. and 25° C., preferably between 18° C. and 22° C., for example 20° C. At the end of the step d) of direct bonding, an assembly 30 is formed. Said assemblage 30 comprises the intermediate layer 22 inserted between the first substrate 10 and the second substrate 20.

The step d) of direct bonding is executed in an atmosphere having a pressure greater than $10^{-4}$ Pa, preferably higher than $10^{-3}$ Pa.

The step d) of direct bonding can be executed at atmospheric pressure. During the bringing into contact of the first face 11 and of the exposed surface of the intermediate layer 22, a bonding wave is initiated using a mechanical pressure exerted at a point of one of the two substrates 10 and 20 to be assembled.

According to an advantageous embodiment, the step d) of direct bonding is executed in a humidity controlled atmosphere, namely an atmosphere that has a low rate of humidity.

According to a first alternative, the step d) of direct bonding in a humidity controlled atmosphere can be executed in an atmosphere having a partial water pressure less than $10^{-1}$ Pa.

To do this, the step d) of direct bonding is executed in a closed chamber, wherein the rate of humidity is controlled.

For example, the rate of humidity can be controlled by controlling the dew point in the bonding chamber. For example the rate of humidity can be controlled by implementing a molecular sieve that makes it possible to provide a dew point temperature of approximately −90° C. and a water content less than 1 ppm in a chamber under atmospheric pressure which corresponds to a partial water pressure less than 0.1 Pa for a total pressure equal to the atmospheric pressure).

According to a second alternative, the step d) of bonding in a humidity controlled atmosphere can be executed in a partial vacuum, with the partial vacuum having a pressure less than 10 Pa, preferably less than 1 Pa, more preferably less than $10^{-1}$ Pa.

When the first face 11 and the exposed surface of the intermediate layer 22 are brought into contact, and the partial vacuum reaches a pressure less than 10 Pa, preferably less than 1 Pa, more preferably less than $10^{-1}$ Pa, a bonding wave is initiated and propagates spontaneously in such a way that the first face 11 and the intermediate layer 22 are bonded to one another by direct molecular adhesion.

The aforementioned first and second alternatives have the interest of reducing the quantity of water present at the bonding interface during the step d). As such little or no reaction products will be observed at the assembly interface, thus preventing the degradation of the electrical, thermal and/or optical proprieties of the assemblies 30 formed as such.

The aforementioned direct bonding modes, executed at atmospheric pressure or moderate vacuum, do not penalise the through put contrary to the known method of prior art.

At the end of the step d), a step e) of heat treatment, more preferably, in a neutral atmosphere, for example under Argon, is executed.

The step e) has for purpose to reinforce the bonding interface of the assembly 30.

The step e) of heat treatment can be executed at a temperature between 200° C. and 600° C.

Particularly advantageously, the first face 11 and the second face 21 are monocrystalline, and the intermediate layer 22 is formed according to a coherent epitaxial growth (it is therefore also monocrystalline). As such, the step e) of heat treatment can be adapted to allow for the connection, at least partial, of the crystalline networks to the interface formed by the first face 11 and the intermediate layer 22. Consequently, the electrical and thermal resistivities are further reduced. Moreover, this configuration is particularly well suited when a structure comprising a monocrystalline phosphide substrate on a second monocrystalline substrate is required.

As such, after a heat treatment executed at 200° C., an electrical resistivity was observed by the Applicant, of the bonding interface of the assembly comprising a monocrystalline intermediate layer (therefore formed according to a coherent epitaxial growth), less than 10 mΩ·cm$^2$.

Figure 5:
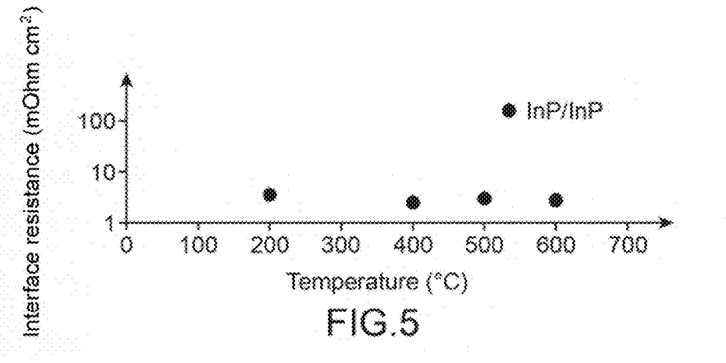
FIG. 5 is a graph showing, according to the ordinate axis, the electrical resistivity (in mOhm·cm$^2$) of assemblies according to the temperature (in ° C.) of heat treatment given according to the abscissa axis.

Such as shown in FIG. 5, the electrical resistivity of the bonding interface of an assembly 30, implying a first monocrystalline face 11 and an intermediate layer 22, monocrystalline, of N-type doped chemical composition InP of about $10^{18}$ atm/cm$^3$ (for example sulphur atoms), is about 5 mΩ·cm$^2$, after a step of heat treatment executed at 200° C. A bonding of an InP substrate on GaAs requires a heat treatment executed at at least 500° C. in order to reach an equivalent level of electrical resistivity.

Advantageously, the intermediate layer 22 comprises doping, for example of the N type, and with a concentration greater than $10^{18}$ atm/cm$^3$, preferably greater than $5\times10^{18}$ atm/cm$^3$.

Moreover, a heat treatment executed at a temperature less than 600° C. limits the deformation of the assembly 30 able to be caused by the differences in the coefficient of thermal expansion (CTE) of the first and second substrates.

Advantageously, the step of heat treatment can be executed at a temperature between 300° C. and 600° C.

Figure 6:
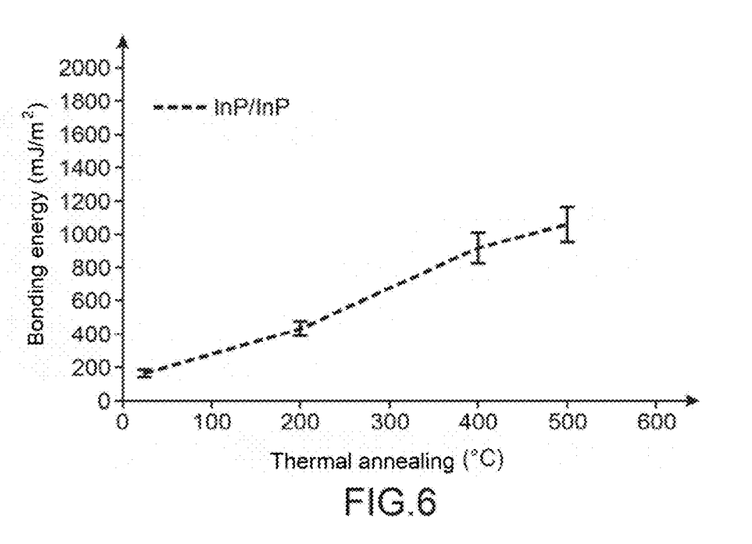
FIG. 6 is a graph showing, according to the ordinate axis, the bonding energy of assemblies (in mJ·m$^{-2}$) according to the temperature (in ° C.) of heat treatment given according to the abscissa axis.

Such as shown in FIG. 6, the bonding energy of an assembly 30 is greater than 600 mJ·m$^2$ after a heat treatment of said assembly 30 executed at a temperature greater than 300° C.

Still advantageously, the step of heat treatment can be executed at a temperature between 300° C. and 500° C.

Figure 7:
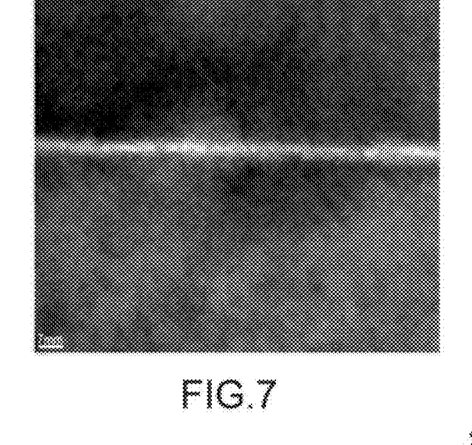
FIG. 7 is an image obtained via transmission electron microscope of the assembly interface formed according to the invention.

For example, a heat treatment executed at 500° C. makes it possible to observe a connection of the crystalline lattices of the first face 11 and of the intermediate layer 22 (shown in FIG. 7).

Particularly advantageously, the step d), of direct bonding, is preceded by a step c1), of preparing the exposed surface of the intermediate layer 22, and of the first face 11.

The preparing of the exposed surface of the intermediate layer 22, and of the first face 11 during the step c1) can also be adapted to render them compatible with a step of direct bonding executed at ambient temperature and without application of an external mechanical pressure. In particular, the step c1) can also be intended to render the exposed surface of the intermediate layer 22, and of the first face 11 hydrophilic.

The step c1) is also suitable for preserving the roughness of the exposed surface of the intermediate layer (22) and of the first face (11). As such, the roughness of the exposed surface of the intermediate layer (22) and of the first face (11) are not affected at the end of the step c1). More particularly, the roughness of the exposed surface of the intermediate layer (22) and of the first face (11) will be preserved during the step c1).

As such, as soon as the roughness of the exposed surface of the intermediate layer (22) and of the first face (11) are less than 1 nm RMS, said exposed surface and said first face will have a roughness less than 1 nm RMS after execution of the step c1).

The step c1) can comprise a deoxidation and/or a passivation of the exposed surface of the intermediate layer 22 and of the first face 11. The step c1) is suited for preserving the crystallinity of the intermediate layer 22 and of the first face 11.

The term "suited for preserving the crystallinity" means a step that does not affect the crystalline quality (no amorphisation), and which does not generate any crystalline defects such as dislocations.

Contrary to FIG. 3a of Uchida et al. [1], the interface formed by the first face 11 and the intermediate layer 22 is still crystalline after the step of direct bonding.

The use of an ionic bombardment of argon in order to deoxidise the surfaces to be assembled, such as proposed by Uchida et al., would have for consequence to amorphise said surfaces. Given its low thickness, the intermediate layer 22 would be amorphised along its entire thickness.

This would then have had the consequence of degrading the electrical, thermal and optical proprieties of the interface formed after direct bonding.

The step c1) can comprise a dry or wet etching. Those skilled in the art are able to determine the conditions and the suitable compounds for executing the step c1), and in this respect can consult the reference [3] mentioned at the end of the description.

By way of example, a step c1) executed by wet etching can comprise the use of a chemical solution comprising at least one of the elements: HF, HCl, $H_2SO_4$, $NH_4OH$, $(NH_4)_2S$, a mixture of $K_2Se$ and of KOH.

The aforementioned chemical solution makes it possible to remove/etch the native oxides that may be present on the first face 11 and the exposed surface of the intermediate layer 22, as well as to passivate said surfaces.

The removal of said native oxides makes it possible to better prepare the first face 11 and the exposed surface of the intermediate layer 22 before the step d) of direct bonding.

Particularly advantageously, the step c1) of preparing the surface, can be executed by a step of radical oxidation of the first face 11, and of the exposed surface of the intermediate layer 22.

The radical oxide formed on each one of the aforementioned faces has the advantage if disappearing at least partially at the step e), of heat treatment.

The radical oxide as such has the advantage of protecting the surfaces to be assembled, and especially of making it possible to carry out a step d), of direct bonding, without having to manage the waiting time between the different steps.

The radical oxidation can be executed in an atmosphere of ozone and/or of oxygen illuminated by ultraviolet radiation.

For example, the ultraviolet radiation can comprise primary wavelengths preferably of about 185 nm and of 254 nm (for example radiation of a low pressure mercury lamp).

The surrounding oxygen can be used as an oxidising species, but the latter can be substituted with ozone.

For example, a layer of radical oxide 1.8 nm thick can be generated on the indium phosphide for an exposure time of 3 minutes.

A first application of this first embodiment makes it possible to form an assembly of InP on silicon. The first application comprises the supply of a monocrystalline substrate of chemical composition InP and a silicon substrate. An intermediate layer of chemical composition InP, 2 nm thick, is then formed on the silicon substrate according to a coherent epitaxial growth. The formation of the intermediate layer is executed by MOCVD at a temperature of 550° C., under a pressure of 100 mbar, with as precursor gases $PH_3$ and TeIn. The step of assembling is then executed under partial vacuum at an atmospheric pressure less than $10^{-1}$ Pa, and is followed by a step of heat treatment at 500° C. for 2 hours. As such, an assembly of InP on silicon is obtained, with an assembly interface having a reduced defectivity, and improved electrical, thermal and optical properties in relation to which is known to the state of the art.

A second application of this first embodiment makes it possible to form an assembly of InP on GaAs. This second mode of application differs from the first mode of application in that the second substrate is a substrate monocrystalline GaAs.

Figure 8:
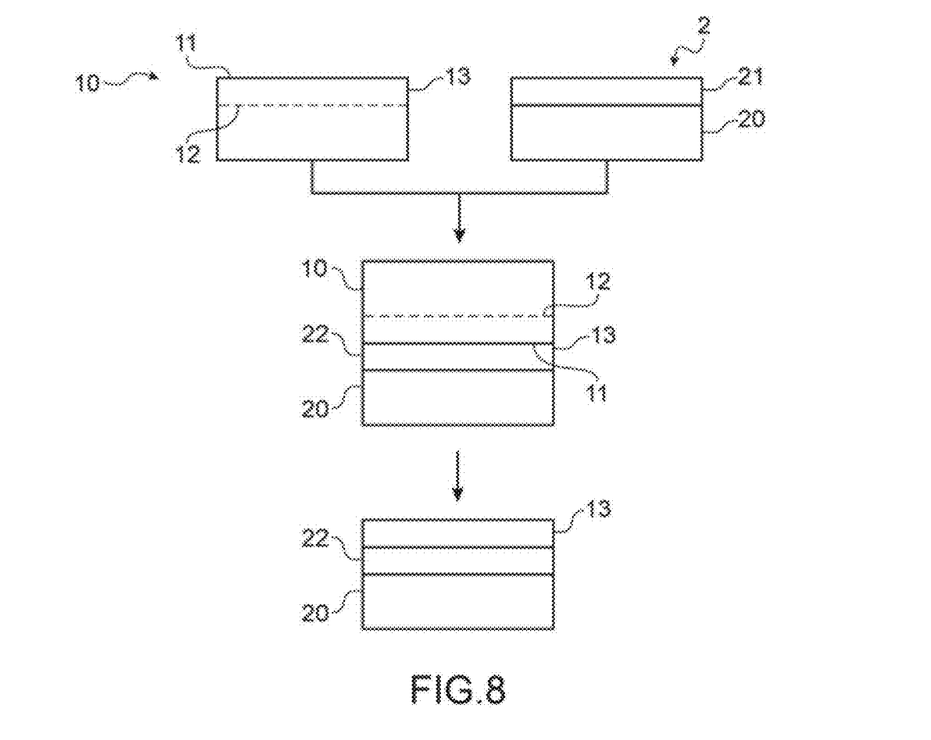
FIG. 8 is schematic representation of the method for assembling according to a second embodiment of the invention.

According to a second embodiment, presented in FIG. 8, which differs from the first embodiment in that a step a2) before the step e), and a step f) after the step e) are executed.

The step a2) comprises the forming of a weakened area 12 in the first substrate 10. The weakened area 12 is substantially parallel to the first face 11.

The weakened area 12 and the first face 11 delimit a useful layer 13.

The useful layer 13, such as described by the following, is intended to be transferred on the exposed surface of the intermediate layer 22.

The weakened area 12 can be formed by implantation of gaseous species through the first face 11, and according to a depth defined by the implantation energy of sad species.

The species implanted can comprise at least one of the elements comprised in the list: H, He.

By way of example, the weakened area 12 is formed by implantation of hydrogen, at an energy of 100 KeV, and at a dose of $6.5 \times 10^{16}$ atm/$cm^2$, in a first substrate 10 made of indium phosphide. As such, a weakened area is formed at a distance of about 900 nm from the first face 11, as such delimiting a useful layer 13, for example with a thickness of 800 nm.

Still according to the second embodiment, a step f) of fracture is executed after the step e) of assembling.

The step of fracturing comprises the initiation and the propagation of a fracture wave within the weakened area 12 in such a way that the first substrate 10 is detached from the useful layer 13, and as such allows for the transfer of said useful layer 13 on the exposed surface of the intermediate layer 22.

The step f) can be carried out by heat treatment, for example a treatment comprising an elevation in temperature.

Advantageously, the heat treatment is executed in an inert atmosphere, for example under Argon, at a temperature between 150° C. and 300° C., and a duration between 30 min and 3 h.

By way of example, for a dose of hydrogen of $6.5 \times 10^{16}$ atm/$cm^2$, implanted at an energy of 100 KeV in a first substrate 10 made of indium phosphide, an annealing executed at a temperature of 275° C., and a duration of 1 h 30 will allow for the initiation and the propagation of a fracture wave within the weakened area.

A step of heterogeneous assembly, contrary to the method according to the invention, generates an interface with no lattice connection and consequently defects able to degrade the electrical and thermal conduction properties, but also the optical properties, for example transparency. However, it is well known that the optical properties of the bonding interface directly affect the performance of the devices, in particular of the photovoltaic cells, intended to be manufactured in or on the heterostructures 30 obtained according to the invention.

REFERENCES

[1] Shiro Uchida et al., *"Room-temperature GaAs/InP wafer bonding with extremely low resistance"*, Appl. Phys. Express, 2014, vol. 7, pages 112301-1-112301-4.
[2] Matthews et al., *"Defects in epitaxial multilayers"*, Journal of Crystal Growth, 1974, vol. 27, pages 118-125.
[3] Paul H. Holloway et al., Handbook of Compound Semiconductors, *"Growth, Processing, Characterization, and Devices"*, Cambridge University Press, 19 Oct. 2008, chapter 7

The invention claimed is:

1. An assembly method, comprising:
a) providing a first substrate comprising a first face made from crystalline indium phosphide, with the first face having a roughness less than 1 nm RMS,
b) providing a second substrate comprising a second crystalline face different from the indium phosphide,
c) forming an intermediate layer of crystalline indium phosphide on the second face of the second substrate, with the intermediate layer comprising an exposed surface having a roughness less than 1 nm RMS,
c1) preparing the exposed surface of the intermediate layer, and the first face, in such a way as to render said exposed surface and said first face hydrophilic, said preparation being suitable for preserving the roughness of the exposed surface of the intermediate layer and of the first face,
d) forming an assembly, via direct bonding at ambient temperature and without applying external mechanical pressure, by bringing the first face of the first substrate into contact with the intermediate layer, the direct bonding being carried out in an atmosphere having a pressure greater than $10^{-4}$ Pa, and
e) subjecting the assembly, formed in d), to a thermal treatment.

2. The method of claim 1, wherein the first face and the second face of the second substrate are monocrystalline, and the intermediate layer is formed according to a coherent epitaxial growth.

3. The method of claim 2, wherein e) is suitable for allowing a connection, at least partial, of the crystalline lattices to the interface formed by the first face and the intermediate layer.

4. The method of claim 1, wherein d) is carried out according to one of the following conditions:
in an atmosphere having a partial water pressure less than $10^{-1}$ Pa,
or
in a partial vacuum, with the partial vacuum having a pressure less than 10 Pa.

5. The method of claim 1, wherein c) is executed by a method of epitaxy.

6. The method of claim 1, wherein e) is executed at a temperature between 200° C. and 600° C.

7. The method of claim 1, wherein c1) is suitable for preserving the crystallinity of the intermediate layer and of the first face.

8. The method of claim 1, wherein the second layer has a thickness less than 5 nm.

9. The method of claim 1, wherein the first substrate is made from indium phosphide.

10. The method of claim 1, wherein the second substrate comprises at least one material selected from the group consisting of gallium arsenide, silicon, silicon and germanium alloy, germanium, sapphire, alumina, silicon carbide, and an alloy of elements III and V.

* * * * *

UNITED STATES PATENT AND TRADEMARK OFFICE
CERTIFICATE OF CORRECTION

PATENT NO.        : 10,283,364 B2
APPLICATION NO.   : 15/774122
DATED             : May 7, 2019
INVENTOR(S)       : Bruno Imbert et al.

Page 1 of 1

It is certified that error appears in the above-identified patent and that said Letters Patent is hereby corrected as shown below:

On the Title Page

Item (71), the Applicant's information is incorrect. Item (71) should read:
-- (71) Applicant: COMMISSARIAT A L'ENERGIE ATOMIQUE ET AUX ENERGIES ALTERNATIVES, Paris (FR); SOITEC, Bernin (FR) --

Signed and Sealed this
Twenty-eighth Day of April, 2020

Andrei Iancu
*Director of the United States Patent and Trademark Office*